United States Patent [19]

Terman et al.

[11] 4,306,300
[45] Dec. 15, 1981

[54] MULTI-LEVEL CHARGE-COUPLED DEVICE MEMORY SYSTEM INCLUDING ANALOG-TO-DIGITAL AND TRIGGER COMPARATOR CIRCUITS

[75] Inventors: Lewis M. Terman, South Salem; Yen S. Yee, White Plains, both of N.Y.

[73] Assignee: International Business Machines Corporation, Armonk, N.Y.

[21] Appl. No.: 108,775

[22] Filed: Dec. 31, 1979

[51] Int. Cl.³ .................. G11C 27/00; G11C 11/34
[52] U.S. Cl. .................................. 365/45; 365/183
[58] Field of Search .............................. 365/45, 183

[56] References Cited

U.S. PATENT DOCUMENTS

| 4,077,035 | 2/1978 | Yee | 340/347 DA |
| 4,130,894 | 12/1978 | Merrill et al. | 365/183 |
| 4,135,104 | 1/1979 | Allen | 365/183 |
| 4,165,537 | 8/1979 | Engeler et al. | 365/183 |
| 4,202,046 | 5/1980 | Ward | 365/183 |

FOREIGN PATENT DOCUMENTS 2753570 8/1978 Fed. Rep. of Germany ...... 365/183

OTHER PUBLICATIONS

Jaeger, "Improved Throughput for CCD Multilevel Storage", IBM Tech. Disc. Bul., vol. 20, No. 2, 7/77, pp. 789–790.

*Primary Examiner*—Stuart N. Hecker
*Attorney, Agent, or Firm*—John J. Goodwin

[57] ABSTRACT

A digital-to-analog conversion (DAC) circuit and trigger comparator combination is described for encoding and decoding charge packets in a common-well multi-level signal charge-coupled memory device (CCD). The DAC circuit, which may be of the weighted capacitor type, is used to generate a staircase waveform and to create the common-well under a first gate in the CCD. The trigger comparator adjacent to a second gate in the CCD is a detection circuit which stays in one binary state until an input charge signal is received, whereupon it switches state. In particular, the weighted capacitor DAC contains an extra offset bit which is used in the analog-to-digital or regeneration operation such that when the trigger comparator switches state, the digital input to the DAC at that time correctly represents the signal charge being converted. In one embodiment a circular serial-parallel-serial memory structure is employed as the multi-level CCD memory system.

10 Claims, 11 Drawing Figures

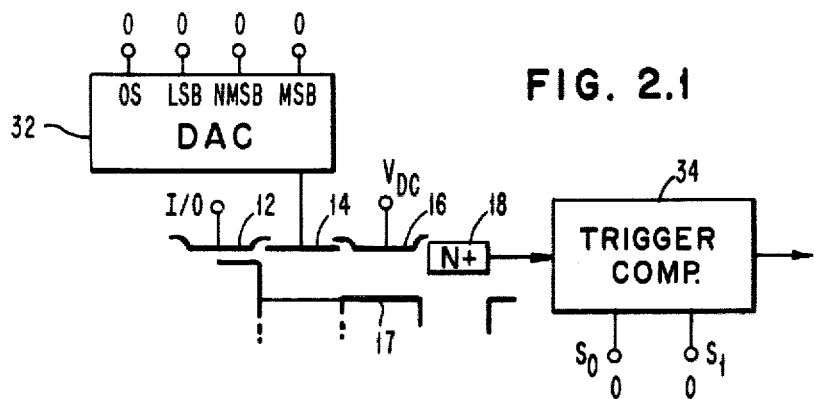
FIG. 2.1
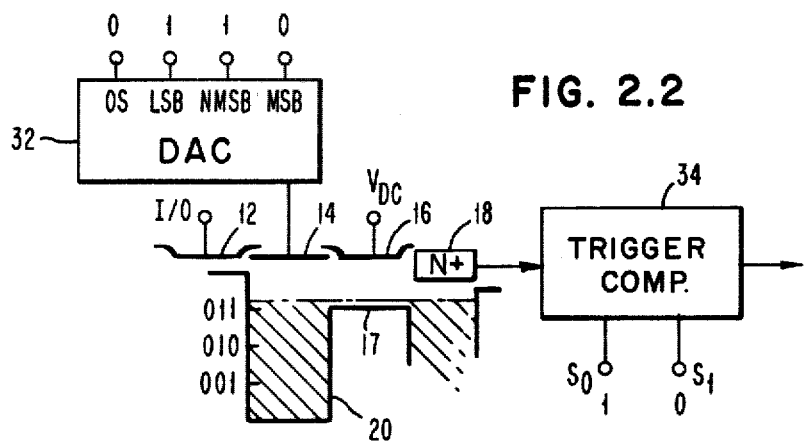
FIG. 2.2
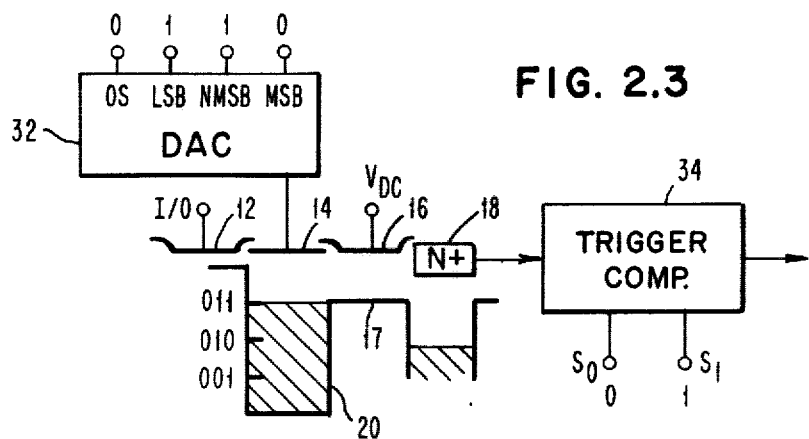
FIG. 2.3

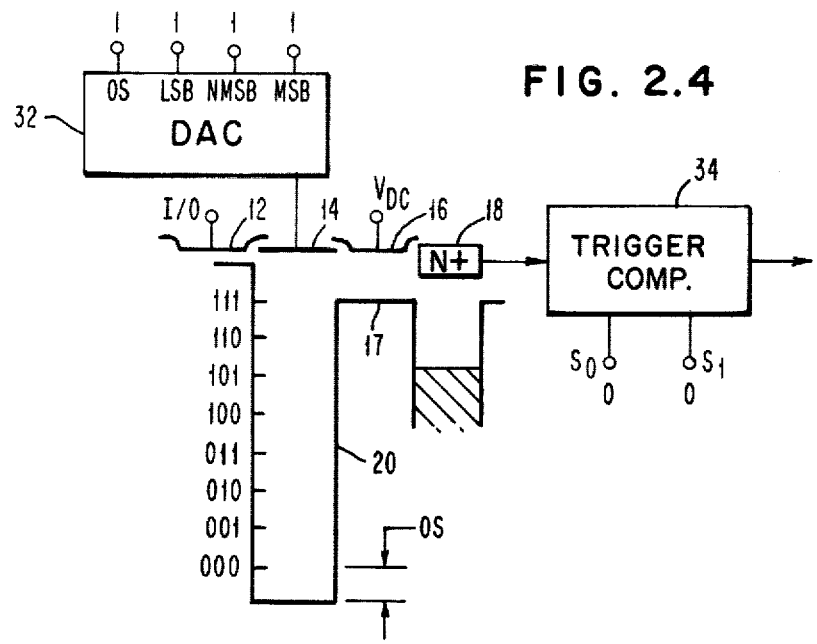
FIG. 2.4
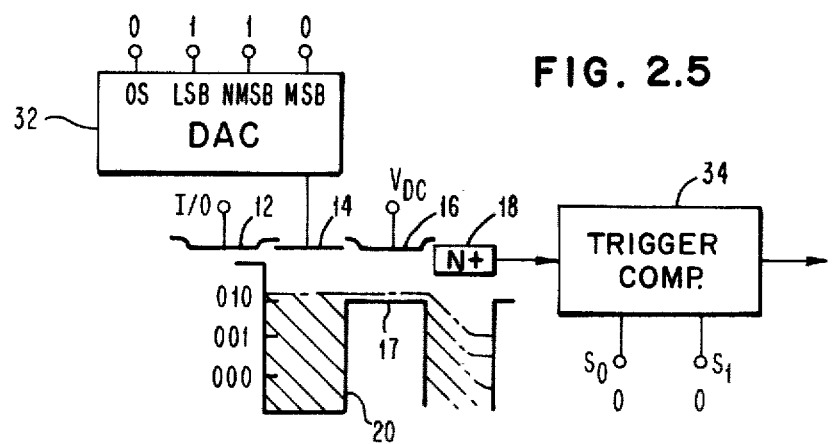
FIG. 2.5

MULTI-LEVEL CHARGE-COUPLED DEVICE MEMORY SYSTEM INCLUDING ANALOG-TO-DIGITAL AND TRIGGER COMPARATOR CIRCUITS

DESCRIPTION

1. Technical Field

This invention relates to input and output circuits in combination with a charge coupled device memory system, and more particularly to a charge-coupled device memory system including a digital-to-analog converter and trigger comparator circuits for increasing memory density.

2. Background Art

Charge-coupled device (CCD) technology has been known heretofore for memory application. Well known CCD devices use a binary or two level signal i.e., a charge packet is stored in one of the two levels for a "0" or a "1" representation. Increased density advantage can result from storing more than one bit of information per charge packet through the use of multi-level storage; for example, four levels to store two bits, eight levels to store three bits, etc. However, the most obvious effect of going to multi-level storage (MLS) is a shrinkage of the worst case sense signal. A simple and effective input and output structure is yet to be found to accurately launch and detect the MLS signal and to make MLS practical.

U.S. Pat. No. 4,085,459 issued on Apr. 18, 1978 entitled, "Multivalued Data Memory System Using A Charge Coupled Element" to Hirabayashi describes a multivalued data memory system using a charge coupled element utilizing either a plurality of voltage level detectors each having a different threshold voltage and having its input connected together to the CCD output node, or a plurality of charge level detectors each having a separate and different reference injector and having its input connected together to the CCD output. The multiple voltage level detector approach tends to load the CCD output node severely and thus further reduce the available small sense voltage signal. The requirement of FET circuits which have different threshold voltages for the purpose of sensing multi-level signals is complex and not easily amenable to conventional low-cost CCD technology. In the multiple charge level detector approach the available signal charge is equally shared, and thus the already much smaller sense signal in the MLS environment is even further reduced. Mismatches in the required multiple threshold voltages in the input transistors, or in the required reference injector would still further reduce the already small signal in each of those two suggested approaches. Further, the number of such detection circuits required increases exponentially with increasing number of bit storage and therefore the available sense signal will decrease in like manner or decrease even faster. This tends to limit very quickly the number of bits in a practical MLS system.

The present invention provides a simple structure common both for the launching and sensing of a multi-level signal such that there is no mismatch error, and any non-linearity is self-cancelling. Degradation of the already small signal window is minimized because no multiple device thresholds or separate reference injectors are required. More particularly, only one detection circuit is required, regardless of the number of bits or signal levels.

Additional prior art includes U.S. Pat. No. 4,130,894 entitled, "Loop Organized Serial-Parallel-Serial Memory Storage System," issued Dec. 19, 1978 to Merrill et al; the publication, "High Sensitivity Charge Comparator for Sensing and Comparing Very Small Charge Packets," by Terman and Yee, IBM Technical Disclosure Bulletin 21, No. 3, 1262-3 (1968); U.S. Patent Application Ser. No. 785,723 entitled "Charge Transfer Device Differencing Circuits" filed Apr. 7, 1977; the publication, "Adaptive Leakage Compensation for CCD," IBM Technical Disclosure Bulletin 21, No. 5, 2144-2145, (1978); U.S. Pat. No. 4,077,035 entitled, "Two-Stage Weighted Capacitor Circuit for Analog-to-Digital and Digital-to-Analog Converters," issued Feb. 28, 1978.

SUMMARY OF THE INVENTION

A digital-to-analog converter (DAC) circuit and a trigger comparator combination is provided for encoding and decoding charge packets in a common-well multi-level signal charge coupled memory device. More particularly a weighted capacitor DAC is used to generate a staircase waveform and to create a common-well under a first gate of the charge coupled device.

Thus, an objective of the present invention to provide a charge packet encoding and decoding circuit structure combination for a multi-level signal storage system.

Another objective of the present invention is to provide a common charge packet generating and sensing structure for minimizing errors due to non-linearity.

Still another object of the present invention is to provide a structure wherein the same DAC used to generate the analog charge packet is used in the analog-to-digital conversion operation to minimize tracking errors or reference charge degradation error.

A further object is to provide common launch and sense structure to operate in combination with a circular serial-parallel-serial memory structure to provide multi-level storage MLS.

The foregoing and other objectives, features and advantages of the invention will be apparent from the more particular description of the best mode of the invention, as illustrated in the accompanying drawings.

BRIEF DESCRIPTION OF THE DRAWINGS

FIGS. 2.1 through 2.5 illustrate an example of a charge packet generation and decoding operation employed in the present invention.

DISCLOSURE OF THE INVENTION

Figure 1:
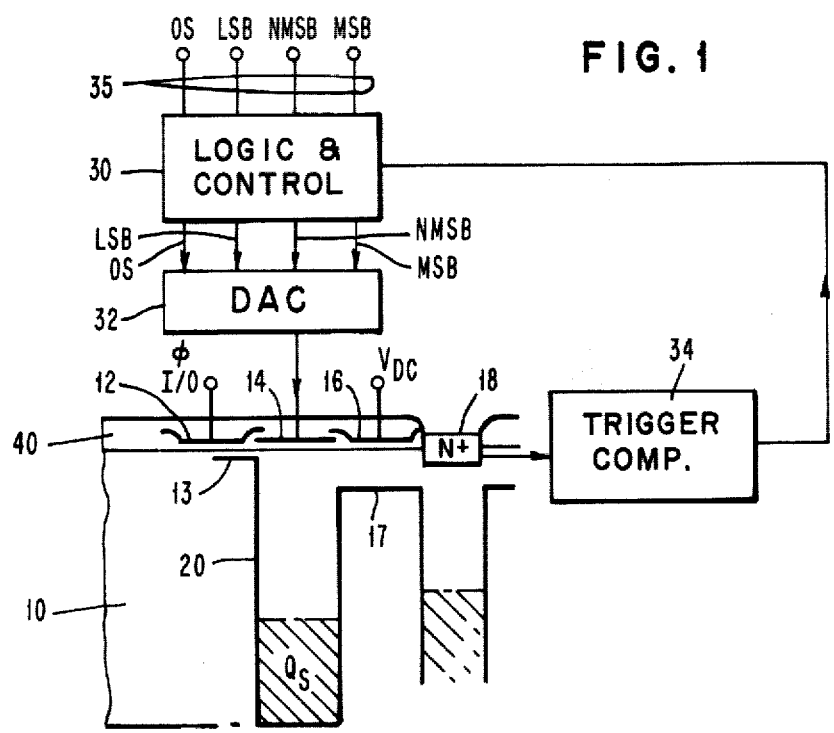
FIG. 1 is a schematic block diagram showing one embodiment of a charge-coupled device analog-to-digital and trigger comparator circuits according to the principles of the present invention.

FIG. 1 shows a part block diagram and part cross-sectional view of a structure for the generation and detection of charge packets for CCD multi-level storage (MLS). The illustrated structure can be fabricated using conventional CCD technology including, for example, a p-type substrate 10 with overlying silicon electrodes 12, 14 and 16 which are embedded in an insulation layer 40 which may be composed of silicon dioxide. The electrodes 12, 14 and 16 may be composed of polysilicon or other suitable conducting materials.

An N+ region 18 is formed in substrate 10 and adjacent to electrode 16. Electrode 16 is connected to a source of potential $V_{DC}$. Electrode 14 is connected to the output of a digital-to-analog converter (DAC) 32 which has its inputs determined by the outputs of a logic and control element 30.

The input of a trigger comparator circuit 34 is connected to the N+ diffusion region 18 and its output is connected as an input to the logic and control element 30 to gate the digital input signal 35 to DAC 32. Electrode 12 is connected to a source of clock pulse designated $\phi_{I/O}$.

To generate and launch an arbitrary charge packet, the logic and control element 30 activates the appropriate input lines to DAC 32 in accordance with the digital signal 35 gated therethrough. The DAC 32 output, which is an analog representation of its digital inputs, creates a potential well 20 subjacent to electrode 14 with a well depth proportional to the DAC 32 output analog voltage impressed on electrode 14. Potential well 20, which is used for both the generation and detection of a multi-level charge packet, and thus will be called common-well 20, is then filled with minority carriers by the conventional fill-and-spill technique over the fixed barrier 17 subjacent to electrode 16 and established by potential $V_{DC}$. More particularly, the charge packet generation is accomplished via the N+ region 18 first by grounding the N+ region 18 to fill common-well 20 and then by raising the potential on the N+ region 18 to spill excess charge out of well over the fixed barrier 17. This particular change in potential of the N+ region 18 is accomplished as part of the trigger comparator 34 operation, and will be more fully explained below.

At the end of the fill-and-spill operation, common-well 20 is filled with minority carriers-electrons; these carriers are referred to as a charge packet. The size of this charge packet, since it is determined by the depth of the common-well 20 below fixed barrier 17, is therefore proportional to the DAC 32 analog output voltage on electrode 14. Since the DAC 32 output analog voltage represents the DAC 32 digital inputs, the charge packet representing the digital inputs to the DAC 32 is created in the common-well 20. The charge packet so created is then launched into a memory register (not shown on FIG. 1) when electrode 12 is pulsed high by $\phi_{I/O}$ to lower barrier 13 subjacent to electrode 12 so as to allow the charge packet in the common-well to leave.

For a decoding of the charge packet, the charge packet comes out of the CCD memory register, and is transferred into common-well 20 via the region subjacent to electrode 12 when $\phi_{I/O}$ is pulsed. However, just prior to the charge packet entering, the common well 20 is set to its maximum depth so that no charge can surmount the barrier 17 subjacent to electrode 16. The depth of the common well 20 is then sequentially reduced one level at at time when the DAC 32 analog output is lowered one level at a time in response to binarily decreasing digital signal 35 gated through the logic and control element 30 until the collapsing of the common-well forces charge to spill over barrier 17 and is collected by the N+ region 18. The trigger comparator 34 is a detection circuit which stays in one binary state until the spill over charge is received, whereupon it switches to its opposite binary state and signals the logic and control element to halt the analog-to-digital conversion process. At this time the DAC 32 digital inputs represent the analog charge packet in the common well and the bit pattern of the charge packet which was launched originally was determined.

A specific example of a step-by-step illustration of the charge packet generation and the refresh or regeneration operations is shown in FIGS. 2.1, 2.2, 2.3, 2.4 and 2.5.

At the start of the packet generation operation, the digital input signal to DAC 32 from the logic and control means 30 is composed of all "0"s. The use of an offset for fat zero charge is obvious to one skilled in the art. The potential on the common well electrode 14 is initially set to be equal to the potential of the barrier electrode 16. The operation and the resulting potential profile is illustrated in FIG. 2.1 wherein the depth of common well 20 is a minimum value.

To generate a specific charge packet common well electrode 14 is isolated and the bits of the digital input signal are applied to the input of DAC 32 to create a potential well 20 under common well electrode 14. For example, FIG. 2.2 shows a 011 input applied to DAC 32 which is followed with a fill operation by application of a "1" bit to the $S_0$ terminal and a "0" bit on the $S_1$ terminal of trigger comparator 34.

FIG. 2.3 illustrates the generation of the desired charge packet after a spill operation, produced by the application of a "1" bit to the $S_1$ terminal and a "0" bit to the $S_0$ terminal of trigger comparator 34, is completed.

At the beginning of a charge packet decoding operation, all digital input bits to DAC 32 (including the offset signal OS) are high, that is, all "1" bits as illustrated on FIG. 2.4. This creates an empty common well 20 of maximum depth.

The analog charge packet of value 011 which is to be decoded is placed in the maximum depth common well after it has been created. To start the analog-to-digital decoding operation the common well 20 is collapsed one level at a time; that is the digital input signals to DAC 32 are systematically reduced one binary count at a time. This step-by-step reduction of the depth of the common well 20 continues until a spill-over of charge is detected by trigger comparator 34, thus determining the associated level of the charge packet in common well 20.

FIG. 2.5 illustrates this analog-to-digital process at the step wherein charge begins to spill over the barrier and the associated 011 level of the charge packet is determined.

Since a common well is used both to generate and to decode the multi-level charge packet, there is no need of any reference injectors and errors due to non-linearity are cancelled out and errors due to non-tracking are minimized. Since only one trigger comparator is needed and there is no requirement of additional detection circuits as the number of signal levels to be encoded increases, the output node of the CCD is not loaded unnecessarily. A normal binary search requires N compares for N-bit MLS. Using the structure and method disclosed in this invention only one precharge cycle and multiple short scan compares are required and thus the operation will be faster than a normal binary search procedure.

Figure 3:
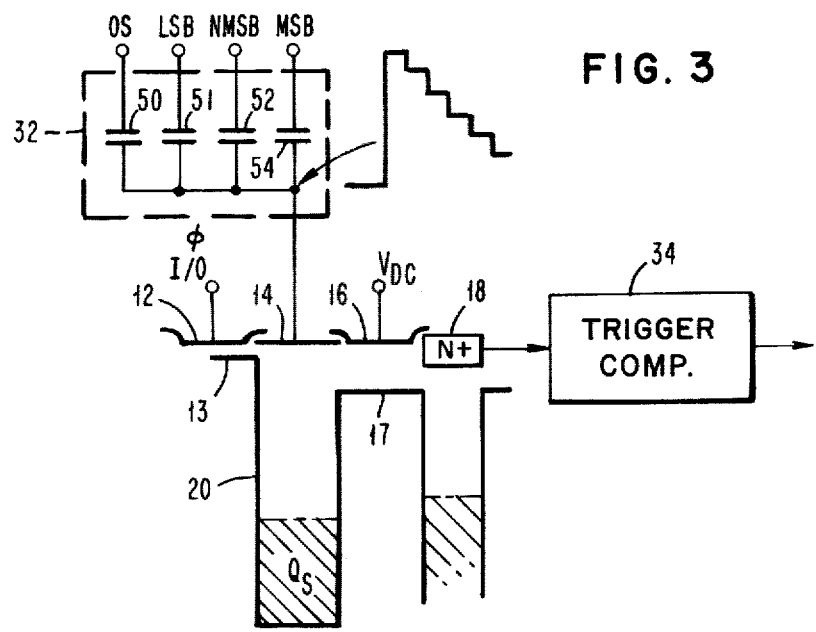
FIG. 3 is a schematic block diagram illustrating a weighted capacitor DAC which may be used in the system in FIG. 1 to generate the staircase waveform for the common-well gate electrode as illustrated.

FIG. 3 shows one embodiment of a digital-to-analog converter which may be employed for the DAC 32 in FIG. 1 when three-bit MLS is involved. The weighted capacitor DAC 32 illustrated FIG. 3 is used to create the common-well 20 and to generate the staircase waveform shown for A/D for the step-by-step regeneration operation previously described. A form of the weighted capacitor DAC shown in FIG. 2 is fully disclosed and explained in the publication "All-MOS Charge Redistribution Analog-to-Digital Conversion Techniques—Part I" by James L. McCreary and Paul R. Gray, IEEE Journal of Solid-State Circuits, December 1975, Vol. SC-10, No. 6, pages 371–379.

As utilized herein, the least significant bit (LSB) capacitor 51 of FIG. 3 consists of two elemental capacitors of value "C" connected in parallel to give a value of 2C, the next most significant bit (NMSB) capacitor 52 consists of four such elemental capacitors in parallel to give a value of 4C, and the most significant bit (MSB) capacitor 54 consists of eight such elemental capacitors. Capacitor 50, connected to the offset input OS, is used to provide an offset potential. If capacitor 50 is equal to a value of C, it will provide a half-bit offset. The manner in which a capacitor ladder digital-to-analog converter functions to produce a staircase waveform as shown in FIG. 3 is well known to those of ordinary skill in the art.

Figures 4, 5:
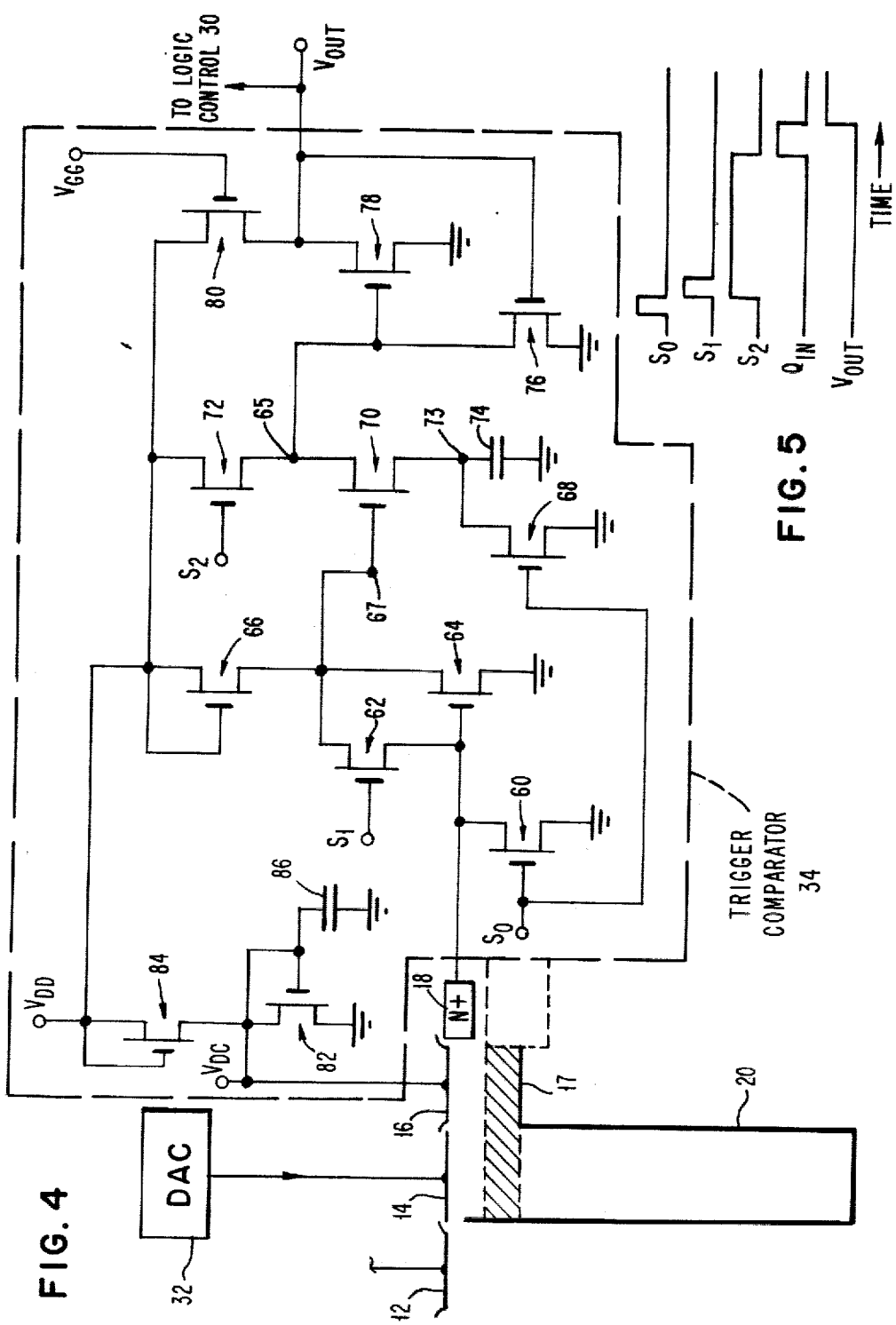
FIG. 4 is a schematic circuit diagram showing a form of the trigger comparator used in the structure in FIG. 1.
FIG. 5 is an illustration of a timing diagram useful in explaining the operation of a circular serial parallel and MLS system incorporating the structure of the present invention.

FIG. 4 is a schematic diagram which illustrates trigger comparator 34 in more detail. The operation of trigger comparator 34 is divided into two time periods, the preconditioning time phase and the comparison time phase. The operation of the circuit of FIG. 4 will be explained with reference to $S_0$, $S_1$, $S_2$ and other waveforms shown in FIG. 5. During the preconditioning period shown on FIG. 5, the inverting amplifier section including devices 64 and 66 is biased in its linear region, the bucket brigade amplifier including devices 68, 70 and 72 and capacitor 74 is precharged and its output node 65 isolated, and the output from comparator 34 is in its low binary state. During the comparison time phase an analog-to-digital conversion is performed by the collapsing of the common well 20 in staircase fashion as previously described, and such conversion is completed when trigger comparator 34 abruptly switches to its opposite (high) binary state.

The charge packet generation operation overlaps the preconditioning operation and is contained within the preconditioning period. To perform a launch operation, DAC 32 places the appropriate analog voltage on electrode 14 and creates a well depth subjacent to the gate proportional to the analog voltage. During the time $S_0$ is high, the well is filled via device 60 and the N+ diffusion, and the bucket brigade amplifier capacitor 74 is discharged by device 68. By raising $S_1$ high and lowering $S_0$ the inverting amplifier, which consists of devices 64 and 66 is biased to its unity gain point by device 62. The unity gain bias potential is high enough such that excess charge over and above the fixed barrier under electrode 16 will spill back to the N+ node to complete the fill and spill operation for charge packet generation. At the end of this operation, the packet under electrode 14 is shifted into the memory register. An empty well of maximum depth is then created under electrode 14 and the packet at the end of the CCD register array is placed into this well for the ADC decoding operation.

While charge packets are shifted out of and into the well under electrode 14, the bucket brigade amplifier including devices 68, 70, 72 and capacitor 74 is precharged by the $S_2$ clock. A sequential turn-off technique is employed, i.e., $S_1$ turns off during $S_2$ high time. The negative transient at the N+ node therefore is absorbed in the bucket the precharge operation at the bucket brigade amplifier. The end of $S_2$ completes the precharge operation and the pre-conditioning of the trigger comparator. At this time, the inverting amplifier is biased in its linear region, the bucket brigade amplifier is precharged in that node 73 has risen to essentially one threshold voltage drop below the potential on the gate of device 70, and its output node 65 is isolated by device 72, and the unbalanced direct cross coupled circuit consisting of devices 72, 78, 80 and 76 has its output low at node Vout.

It should be emphasized that switching transients do not affect the proper operation of the trigger comparator. The transient caused by $S_1$ going low is absorbed by the precharge operation and the transient associated with $S_2$ going low is contained because of the wide noise margin provided for (about 2 Volts) in the unbalanced direct cross coupled circuit devices 72, 78, 80 and 76.

In the comparison phase, with the charge packet to be decoded in the well under electrode 14, the DAC output decreases in a staircase fashion. As this process continues, the common well depth collapses proportionally. This process terminates at the point when charge begins to spill over the fixed barrier under electrode 16 onto the N+ input node 18. The resulting negative signal at the input node 18 is enlarged by the inverting amplifier. The enlarged positive signal appears at the input node 67 of the bucket brigade amplifier causing its output node to drop. However, as soon as this voltage decreases beyond the transition point (at about 3 Volts) of the unbalanced direct cross coupled circuit, the positive feedback takes effect and quickly discharges the isolated output node of the bucket brigade amplifier and causes the comparator output to go high abruptly.

Figure 6:
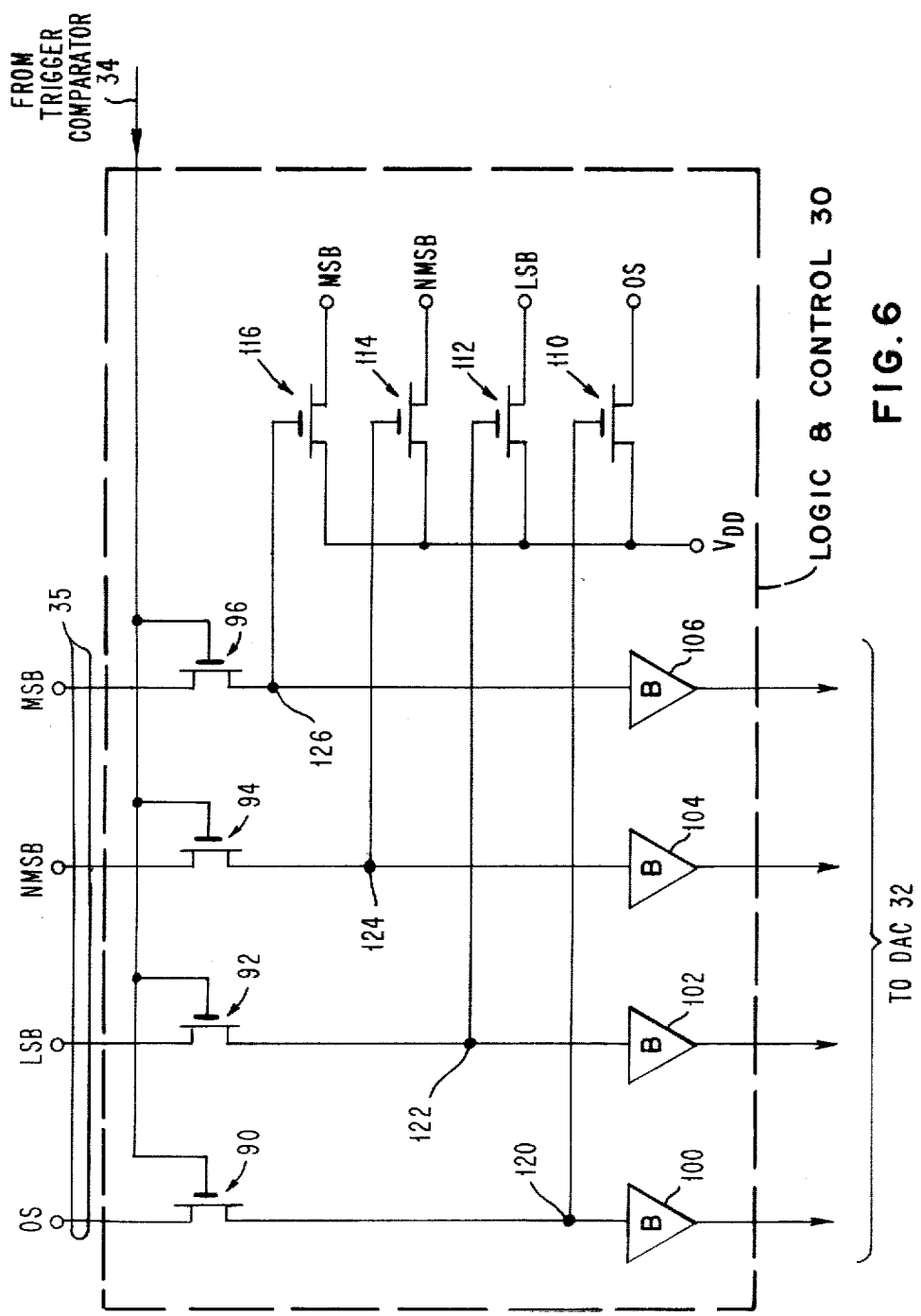
FIG. 6 is a schematic diagram of an embodiment of a logic and control circuit employed in the present invention.

FIG. 6 provides a more detailed schematic illustration of the logic and control element 30. Logic and control element 30 functions primarily as a gate circuit and includes a plurality of series transmission gates 90, 92, 94 and 96 for the digital input signal lines 35. Buffer circuits 100, 102, 104 and 106 and devices 110, 112, 114 and 116 are also included in the structure. Devices 110, 112, 114 and 116 are used to sample the levels on the digital signal lines.

In operation, when the output from trigger comparator 34 is high, devices 90, 92, 94 and 96 act as transmission gates allowing the input signals OS, LSB, NMSB and MSB to be gated through and out to the input of DAC 32.

When the output from trigger comparator 34 goes low, the output to DAC 32 are gated off from the digital signals 35 and the outputs to DAC 32 are determined by the voltage conditions which exist on nodes 120, 122, 124 and 126 when the output from trigger comparator 34 went low.

The structure of the present invention may be employed with a serial-parallel-serial (SPS) memory structure for charge-coupled device multi-level storage (CCD-MLS). Since the common well trigger comparator approach to CCD-MLS demands the charge packet to be returned to the same well, the conventional serial-parallel-serial (SPS) memory organization is not ideal because charge packets enter at one corner and leave at the diagonally opposite corner of the SPS block. A separate shift register or a precision and noise-free charge transport circuit would be required to return charge packets from the output port to the common well at the input port. A more optimum memory organization is the Circular Serial-Parallel-Serial (CSPS) structure shown in FIG. 7 and more fully described in the aforementioned U.S. Pat. No. 4,130,894 to Merrill et al. In this organization, as depicted in the figure, the shifting in the bottom serial register is from right to left (instead of from left to right into another similar structure). At this point, the bit order is reversed. The charge packets are then shifted up in the parallel section. The bit order is then restored when charge packets are shifted from left to right in the upper serial register to return the charge packet to the common well for the analog-to-digital or regeneration operation.

Figure 7:
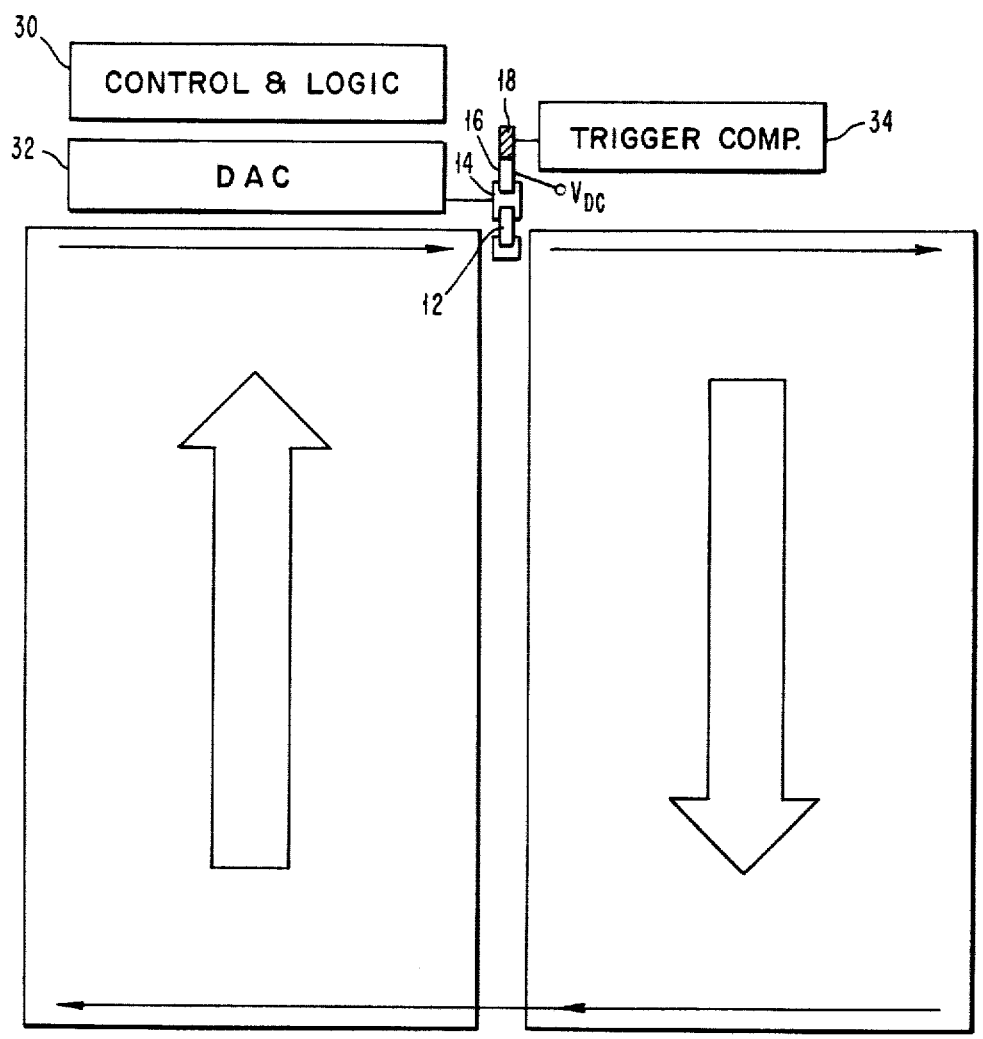
FIG. 7 is a schematic block diagram showing the present invention employed in combination with a circular serial-parallel-serial memory structure.

The structure of FIG. 7 also illustrates the manner in which the circuit of FIG. 1 is combined with the CSPS structure.

A salient feature of the block design of FIG. 7 is its extentability. With a DAC of sufficient resolution, and only changing the control timings, the same organization could be used for binary storage, two-bit, three-bit and high order bit CCD-MLS.

While the invention has been particularly shown and described with reference to a preferred embodiment thereof, it will be understood by those skilled in the art that the foregoing and other changes in form and details may be made therein without departing from the spirit and scope of the invention.

Having thus described out invention, what we claim as new, and desire to secure by Letters Patent is:

1. A structure for the generation and detection of charge packets comprising:
   a charge-coupled-device including a semiconductor substrate,
   means for creating a potential well in said semiconductor substrate having a depth proportional to a selected digital signal value less than a given maximum value,
   means for filling said potential well with electrical charge carriers to produce a charge packet having an analog value representative of said selected digital signal value,
   means for transferring said charge packet out of said potential well and into an external memory register,
   means for increasing said potential well in said semiconductor substrate to a maximum depth proportional to said given maximum digital value after said charge packet is transferred,
   means for transferring said charge packet out of said external memory register and into said maximum depth potential well,
   and means for sequentially decreasing the depth of said potential well until the depth of said potential well is equal to the level of said charge packet wherein said depth of said potential well is representative of the analog value of said charge packet.

2. A structure for the generation and detection of charge packets according to claim 1 wherein said means for creating said potential well in said semiconductor substrate include a source of digital signals, a digital-to-analog converter circuit connected to said source of digital signals for producing an analog signal representative of the digital signals therefrom, and an electrode connected to said digital-to-analog converter circuit and to said substrate for creating a potential well in said substrate proportional to said analog signal from said digital-to-analog converter.

3. A structure for the generation and detection of charge packets according to claim 2 wherein said semiconductor substrate is composed of material of a first conductivity type and includes a region of material of second conductivity type which functions as a source of said electrical charge carriers.

4. A structure for the generation and detection of charge packets according to claim 3 wherein said means for sequentially decreasing said depth of said potential well includes a trigger comparator circuit connected to said region of material of second conductivity type and to said source of digital signals for applying a control signal to said source of digital signals when said depth of said potential well is representative of the analog value of said charge packet, said source of digital signals thereby producing a digital signal representative of said analog value.

5. A structure for the generation and detection of charge packets according to claim 4 wherein said external memory register is a serial-parallel-serial multi-level storage means wherein charge packets are entered into an input region in series, shifted through said storage means in parallel, and transferred out of an output means in series.

6. A structure for the generation and detection of charge packets comprising:
   a charge-coupled device including a semiconductor substrate of a first conductivity type material, at least three electrodes in a linear arrangement proximate to and in electrical contact with said substrate, and a region of second conductivity type material located in said substrate proximate to a first one of said electrodes, said region of second conductivity type material being a source of electrical charge carriers, said first one of said electrodes being a barrier electrode connected to a source of electrical potential for creating a potential level barrier in said substrate under said first electrode,
   a logic and control circuit for producing digital signals,
   a digital-to-analog converter circuit having an input connected to the output of said logic and control circuit and an output connected to a second one of said electrodes of said charge-coupled-device, said digital-to-analog converter circuit producing an analog signal having a value representative of a digital signal value from said logic and control circuit for creating a potential well in said substrate under said second electrode, said potential well having a depth proportional to said analog signal,
   and a trigger comparator circuit having an input connected to said region of second conductivity type material on said substrate and an output connected to said logic and control circuit, said trigger comparator circuit applying an electrical potential level on said region of second conductivity type material to produce electrical charge carriers which transfer over said potential level barrier and fill said potential well under said second electrode to create a charge packet proportional to said value of said analog and digital signals.

7. A structure for the generation and detection of charge packets according to claim 6 further including a source of input/output control signal connected to a third one of said electrodes of said charge-coupled-device for applying an output control signal to said third electrode for transferring said charge packet from said potential well out of said charge-coupled-device and into an external memory register.

8. A structure for the generation and detection of charge packets according to claim 7 wherein an input control signal from said source of input/output control signal is applied to said third electrode of said charge-coupled-device for transferring said charge packet out of said memory register and back into a maximum depth potential well in said charge-coupled device produced by a maximum value digital signal from said logic and control means and applied to said second electrode through said digital-to-analog converter circuit, wherein said maximum value digital signal from said logic and control means is reduced in a series of decreasing digital values for correspondingly reducing the value of said analog signal on said electrode to sequentially reduce the depth of said potential well to cause said charge carriers of said charge packet therein to spill over said barrier level and into said region of second conductivity material, and wherein said spill over of said charge packets into said region of second conductivity material is detected by said trigger comparator circuit connected thereto for producing a signal which is coupled to said logic and control means to stop said decreasing digital values at a digital value representative of said analog value of said charge packet in said potential well.

9. A structure for the generation and detection of charge packets according to claim 8 wherein said digital-to-analog converter circuit includes a plurality of capacitor networks connected in parallel, one of said capacitor networks having a value of n and the other of said plurality of capacitor networks having scale values differing from n by a different multiple value of n.

10. A structure for the generation and detection of charge packets according to claim 9 wherein said external memory register is a serial-parallel-serial multi-level storage means wherein charge packets are entered into an input region in series, shifted through said storage means in parallel, and transferred out of an output means in series.

* * * * *